(12) United States Patent
Kiguchi et al.

(10) Patent No.: US 6,973,710 B2
(45) Date of Patent: Dec. 13, 2005

(54) METHOD AND APPARATUS FOR MAKING DEVICES

(75) Inventors: Hiroshi Kiguchi, Suwa (JP); Masahiro Furusawa, Suwa (JP); Hirotsuna Miura, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 263 days.

(21) Appl. No.: 10/197,462

(22) Filed: Jul. 18, 2002

(65) Prior Publication Data

US 2003/0024103 A1 Feb. 6, 2003

(30) Foreign Application Priority Data

Aug. 3, 2001 (JP) ....................................... 2001-236369

(51) Int. Cl.[7] .............................................. H01Q 17/00
(52) U.S. Cl. ............................ 29/601; 29/729; 29/745; 29/852; 29/890.1; 216/13; 216/24; 270/1.01; 343/895; 343/741; 347/63; 347/64; 347/65; 438/149; 438/490; 438/502; 438/669
(58) Field of Search .......................... 29/601, 729, 745, 29/852, 890.1; 216/13.24; 270/1.01; 343/895, 741; 347/63–65; 438/149, 490, 502, 669

(56) References Cited

U.S. PATENT DOCUMENTS

| | | | | |
|---|---|---|---|---|
| 6,051,508 A | * | 4/2000 | Takase et al. | ............... 438/724 |
| 6,063,527 A | * | 5/2000 | Nishikawa et al. | ............. 430/7 |
| 6,518,087 B1 | * | 2/2003 | Furusawa et al. | ............. 438/96 |
| 6,733,868 B1 | * | 5/2004 | Kanbe et al. | ............ 428/195.1 |

FOREIGN PATENT DOCUMENTS

| | | | | |
|---|---|---|---|---|
| JP | 05167330 A | * | 7/1993 | .......... H01Q/13/08 |
| JP | A-7-326235 | | 12/1995 | |
| JP | A-9-69334 | | 3/1997 | |
| JP | A-9-131914 | | 5/1997 | |
| JP | A-9-260808 | | 10/1997 | |
| JP | A-11-204529 | | 7/1999 | |
| JP | A-2000-137873 | | 5/2000 | |
| JP | A-2002-98994 | | 4/2002 | |
| JP | A-2003-518755 | | 6/2003 | |
| WO | WO 01/47044 A2 | | 6/2001 | |

OTHER PUBLICATIONS

"Development of aperiodic instability on liquid metal surface perturbed by thermal fluctuations"; Baskin, L.M.; Electrical Insulation, IEEE Transactions; Dec. 1 1989; pp.:929–931.*

* cited by examiner

Primary Examiner—A. Dexter Tugbang
(74) Attorney, Agent, or Firm—Oliff & Berridge, PLC

(57) ABSTRACT

A method and an apparatus for manufacturing a device are provided. The method and the apparatus can form micro wiring without undesired wetting and spreading using an inexpensive functional-liquid supplying method. A method for forming a device, such as a radiofrequency identification tag, includes: making patterns at a plurality of sections having different degrees of affinity to the functional liquid on a substrate to form the device; and supplying the functional liquid to the selected section having high affinity to the functional liquid. Forming the plurality of sections having different degrees of affinity to the functional liquid includes, for example: supplying an organosiloxane film on the substrate, and exposing the organosiloxane film through an optical mask.

6 Claims, 5 Drawing Sheets

(1)

0 2cm (2)

(1)

(2)

(3)

(4)

100: device manufacturing apparatus

METHOD AND APPARATUS FOR MAKING DEVICES

BACKGROUND OF THE INVENTION

1. Field of Invention

The present invention relates to methods and apparatuses for making devices. In particular, the invention relates to enhancements of methods and apparatuses for making devices by forming a desired pattern on a substrate by a functional-liquid supplier, such as an inkjet discharger or the like.

2. Description of Related Art

Circuit devices, such as semiconductor devices and the like, are made by forming circuit patterns or wiring patterns on substrates made of materials, such as silicon, glass, polyethylene terephthalate (PET), or polyimide. In the related art, these devices have been made by a lithographic method, for example. In the lithographic method, a photosensitive material, which is called a resist, is supplied onto a substrate and is developed by irradiation on a circuit pattern. Metal ions are then implanted to form the circuit pattern. The lithographic method requires large-scale equipment and complicated steps. Therefore, the manufacturing cost is also high.

An example of a method for forming wiring patterns is an etching method. In this method, a metal foil is affixed to the surface of a substrate, and a resin resist is applied to perform patterning by photolithography or the like and to remove the metal foil at the portions where the resist is removed. However, the etching method is expensive. A method whereby the wiring pattern is supplied by printing has been proposed, but the quality provided by this method varies from one wiring pattern to another, thus causing a quality instability problem.

Another possible method for forming a wiring pattern is by discharging a metal-containing liquid, instead of ink, onto a substrate using an inkjet discharging head. The resolution of the inkjet discharging head is high, e.g., 400 dpi. Thus, a desired pattern having a width measurable in micrometers can be formed without equipment, such as a semiconductor plant, if a functional liquid can be discharged from individual nozzles (apertures).

SUMMARY OF THE INVENTION

However, when droplets discharged by the inkjet method land on the surface of the substrate, the droplets spread excessively on the surface of the substrate, or the shape of the droplets remains as the outline of the wiring pattern, thereby forming irregularities of the substrate surface, which is a problem.

Moreover, no method or apparatus that can efficiently form three-dimensional wirings, which connect each electric circuits positioned on the different layers of the multiple-layers substrate, exists in the related art.

The present invention provides a method and apparatus for making a device by which micro wiring can be formed using an inexpensive functional-liquid supplying method without undesirable wetting and spreading of the droplets.

The present invention also provides a method and an apparatus for efficiently making a device having three-dimensional wiring.

The present invention therefore provides a method for making a device by supplying a functional liquid onto a substrate to form the device. The method includes: making patterns with the functional liquid at a plurality of sections having different degrees of affinity to the functional liquid on the substrate to form the device, and supplying the functional liquid to selected sections having high affinity to the functional liquid among the plurality of the sections.

In the above manufacturing method, the substrate to form the device is preferably a substrate for a radiofrequency identification tag, and the functional liquid is preferably a metal containing liquid to form an antenna of the radiofrequency identification tag.

In the above manufacturing method, forming the plurality of sections having different degrees of affinity to the functional liquid preferably includes: forming an organosiloxane film on the substrate, and exposing the organosiloxane film through an optical mask.

In the above manufacturing method, forming the plurality of sections having different degrees of affinity to the functional liquid preferably includes: forming a fluoroalkylsilane film on the substrate, and exposing the fluoroalkylsilane film through an optical mask.

In the present invention, another method for forming a device by supplying a functional liquid on a substrate to form the device includes: making patterns of banks for preventing overflow of the functional liquid on the substrate to form the device, and supplying the functional liquid on selected areas inside the banks.

In the present invention, an apparatus for making a device by supplying a functional liquid on a substrate to form the device, includes a patterning unit to make patterns on a plurality of sections having different degrees of affinity to the functional liquid on the substrate to form the device, and a functional-liquid supplier to supply the functional liquid to selected sections having high affinity to the functional liquid among the plurality of sections.

In the above device making apparatus, the substrate to form the device is preferably a substrate for a radiofrequency identification tag, and the functional liquid is preferably a liquid containing metal to form an antenna of the radiofrequency identification tag.

In the above device making apparatus, the patterning unit to form the plurality of sections having different degrees of affinity to the functional liquid preferably includes: a photosensitive material supplying unit to supply an organosiloxane film on the substrate, and an exposing unit to expose the organosiloxane film through an optical mask.

In the above device making apparatus, the patterning unit to form the plurality of sections having different degrees of affinity to the functional liquid preferably includes: a photosensitive material supplying unit to supply a fluoroalkylsilane film onto the substrate, and an exposing unit to expose the fluoroalkylsilane film through an optical mask.

In the present invention, another apparatus for making a device by supplying a functional liquid onto a substrate to form the device includes: a patterning unit to make patterns of banks to prevent the overflow of the functional liquid on the substrate to form the device, and a functional liquid supplying unit to supply the functional liquid on selected areas inside the banks.

In the present invention, yet another method for making a device by supplying a metal-containing liquid onto a substrate to form the device includes: forming a hole in the substrate to form the devices, and supplying the metal-containing liquid into the hole.

In the above device making method, terminals of electrical circuit devices are preferably disposed in the hole at different positions in the substrate thickness direction.

Preferably, in the above device making method, the substrate has a multilayer structure including: a plurality of electrical circuit layers, and at least one insulating layer between the electrical circuit layers. The metal-containing liquid in the hole electrically connects electrical circuits of different layers to each other.

In the above device making method, the hole is preferably replaced with a plurality of slits extending in parallel to each other in a particular direction in the substrate surface.

In the present invention, yet another apparatus for making a device by supplying a metal-containing liquid to a substrate to form the device includes: a processing unit to form a hole in the substrate to form the device, and a liquid supplying unit to supply the metal-containing liquid into the hole.

DETAILED DESCRIPTION OF PREFERRED EMBODIMENTS

The embodiments of the present invention will now be described with reference to the drawings.
<First Embodiment>

This embodiment is described the formation of an antennal for a radio frequency identification (RFID) tag as an example.
(Mechanism of RFID tag)

An RFID tag is an electronic circuit used in a so-called radiofrequency identification system. This system includes three parts: (1) a transponder (transmitter-receiver) called a "tag"; (2) a tag reader; and (3) a data processing system, such as a computer.

The tag reader includes an electronic device and an antenna, generates radio waves to activate the tag, and receives a radio signal from the tag. The received data is checked and decoded by the electronic device.

The tag includes an IC and an antenna. The IC has a memory section that stores an identification code and other data. The content of the memory is transmitted via radio waves to the tag reader when the IC chip is operated.

In most RFID systems, the tag reader emits radio waves to a particular zone that is determined by the frequency employed by the system and the size of the antenna. When one tag passes through this zone, the tag detects the radio waves from the tag reader and transmits the data stored in the tag.

The tag reader, after receiving the data from the tag, decodes the data and determines whether the data is valid. If the data is valid, it is transmitted to the data processing system, such as a computer.

Tags are classified into two types: active types and passive types. An active tag operates by power from a battery either connected to the tag or installed inside. Active tag are advantageous since the power supply from the tag reader can be decreased and the readable distance is generally long. A passive tag does not require an external power source and operates by the power obtained from the energy emitted from the tag reader. Passive tags are much lighter and smaller than active tags, are inexpensive, and have no substantial limit to their lifetime.
(Configuration of RFID tag)

Figure 1:
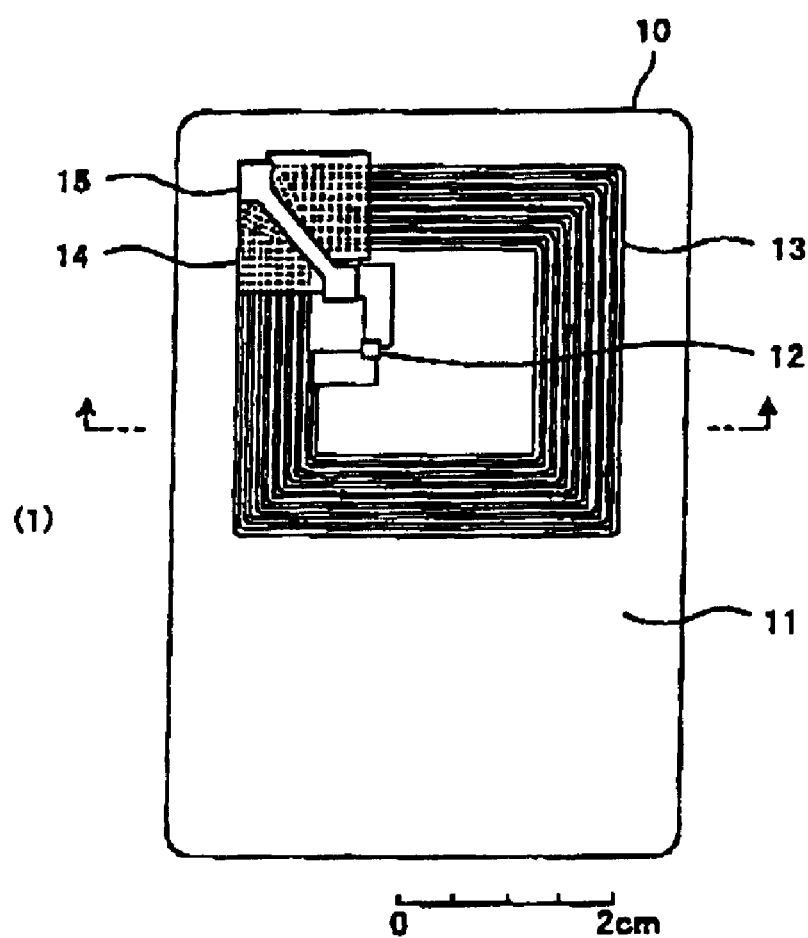
FIGS. 1(1) and 1(2) are a plan view and a cross-sectional view, respectively, of an RFID tag made by a method according to an embodiment of the present invention.
Figure 1:

FIGS. 1(1) and 1(2) are a plan view and an auxiliary cross-sectional view, respectively, of an RFID tag made by a method according to the embodiment of the present invention. As shown in FIG. 1(1), an RFID tag 10 includes an IC 12 formed on a PET substrate 11, a spiral antenna 13 connected to the IC, a solder resist 14 formed on part of the antenna, and a Ag line 15 formed on the solder resist. The Ag line 15 connects the ends of the antenna to each other so as to form a loop.

The antenna 13 is formed into a spiral on the substrate 11 with a predetermined gap between windings. Each winding of the spiral is arranged so as not to be short-circuited with the adjacent windings. In order to prevent short-circuiting of the windings, the metal that makes the antenna must be accurately arranged at predetermined positions on the substrate. In discharging a metal-containing liquid to form the antenna onto the substrate by an inkjet method, the outline of the antenna must not have irregularities of the surface.
(Method for making RFID tag)

In this embodiment, plural sections having different degrees of affinity to the metal-containing liquid or liquid containing conductive material (hereinafter "functional liquid") to make the antenna are formed with desired patterns. Subsequently, the liquid is discharged by the inkjet method. The plural sections having different degrees of affinity are preferably a combination of sections having high affinity and sections having no affinity. To be more specific, a high-affinity section is provided in the section where the antenna is to be formed, and a no-affinity section is provided in the section where no antenna is to be formed. In particular, when the metal-containing liquid to form the antenna, e.g., a colloidal solution of Au, Ag, Cu, or the like, is aqueous, the section where the antenna is to be formed is hydrophilic, and the section where no antenna is to be formed is hydrophobic. When the metal-containing liquid is a hydrophobic organic solvent, the section where the antenna is to be formed is oleophilic, and the section where no antenna is to be formed is oleophobic.

Figure 2:
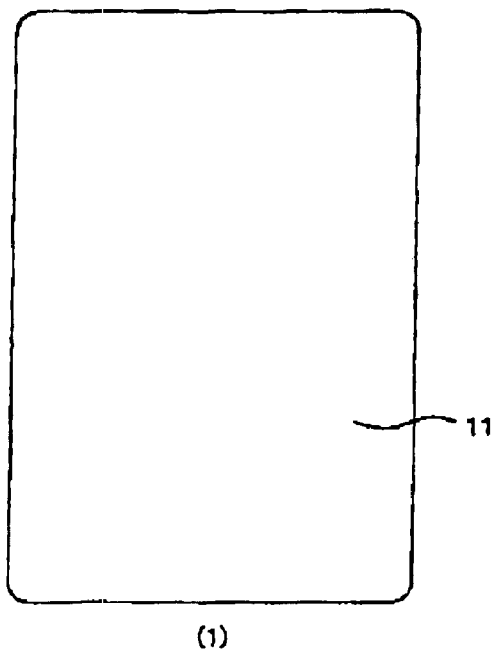
FIGS. 2(1)–2(4) are schematics that show manufacturing steps of the method for making the RFID tag.
Figure 2:
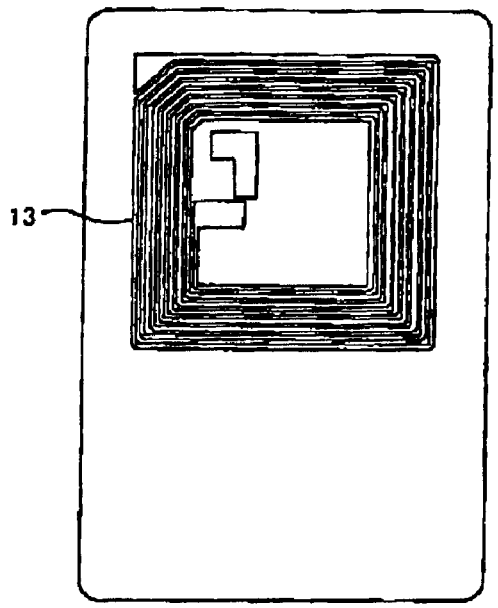
Figure 2:
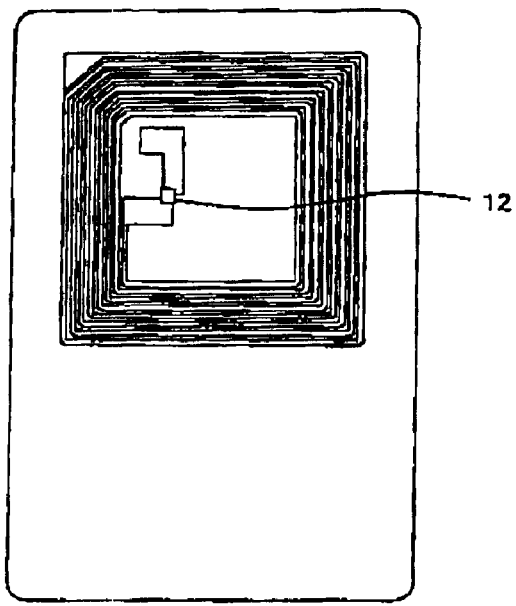
Figure 2:
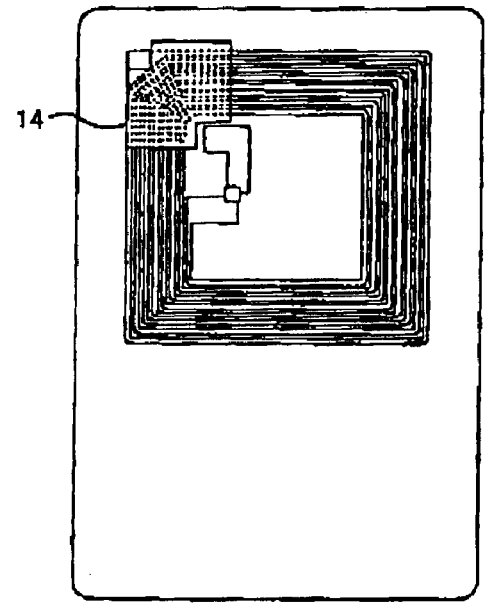

FIGS. 2(1) to (4) are schematics that show manufacturing steps of a method for making the above-described RFID tag. An example of a method for forming patterns including sections having different degrees of affinity on the substrate is a method employing an organosiloxane. For example, liquid containing an organosiloxane containing a titanium oxide (TiO2) photocatalyst is applied on a polyimide substrate, as shown in FIG. 2(1), by a spin-coating method or an inkjet method, and is exposed through an optical mask to 254 nm ultraviolet light from a mercury lamp. The exposed portion of the hydrophobic organosiloxane becomes hydrophilic.

Subsequently, wiring is drawn with an Au colloidal solution, i.e., "perfect gold" available from Vacuum Metallurgical Co., Ltd., by an inkjet method. The resulting wiring is baked in air at 250° C. for 30 minutes so as to obtain a gold antenna wiring 13 shown in FIG. 2(2). In making the RFID tag, an IC is mounted, as shown in FIG. 2(3), and the solder resist 14 is applied by the inkjet method, as shown in FIG. 2(4). An Ag colloidal solution, i.e., "perfect silver" available from Vacuum Metallurgical Co., Ltd., is applied by the inkjet method and is baked at 250° C. for 30 minutes so as to form the Ag line 15 which connects the ends of the antenna 13 to each other so as to form a loop. The RFID tag 10 shown in FIG. 1 is thus manufactured.

It may be difficult to form an IC of the same size as the IC 12 shown in FIGS. 2(1)–2(4) by the inkjet method considering the resolution of present inkjet methods. However, a larger IC can be manufactured by the inkjet method. By performing all of the steps by the inkjet method, the production efficiency and the cycle time can be drastically enhanced. Moreover, inexpensive RFID tags can be manufactured by enhancing the production efficiency and reducing the manufacturing cost, and disposable RFID tags may become a practical option.

In the above example, liquid containing organosiloxane is applied on the entire surface of the substrate, and the section that needs to be hydrophilic is exposed to light. However, organosiloxane need not be applied on the entire surface of the substrate. In particular, when the metal-containing liquid is discharged to the section where the antenna is to be formed by an inkjet method, it is sufficient to have the metal-containing liquid stay in the section where the antenna is to be formed and not in the section where the antenna is not to be formed. Thus, while the section where the antenna is to be formed needs to be hydrophilic, only the border area with the hydrophilic area in the section where the antenna is not to be formed needs to be hydrophobic. Thus, within the section where the antenna is not to be formed, no organosiloxane needs to be applied in the regions sufficiently distant from the border with the section where the antenna is to be formed.

Another example of a method for making hydrophilic & hydrophobic patterns on the substrate is a method using fluoroalkylsilane (FAS). Fluoroalkylsilane is a long molecule having a fluoroalkyl group and a hydrolysis group, e.g., halogen, ethoxy, methoxy, or the like, at the two ends. A siloxane bond is formed by the reaction of the hydrolysis group and the hydroxy group on the substrate, and, as a result, a film exposing fluoroalkyl groups is formed on the surface of the substrate. This film is monomolecular in most cases, which is particularly preferable because a monomolecular film has a uniform thickness and a uniform liquid-repellent property over the entire surface. For example, perfluorodecyl-1,1,2,2-tetrahydro-decyl-triethoxysilnae (FAS 17) and the substrate are placed in a hermetically sealed container, and heated at 120° C. for 2 hours to form a liquid-repellent monomolecular film. This fluoroalkylsilane film becomes hydrophilic by the radiation of UV light. More preferably, a suitable photocatalyst is used.

The material to form the antenna wiring 13 or the like is not limited to the above described material. For example, a Cu-SOM liquid available from Vacuum Metallurgical Co., Ltd., a nano-paste from Harima Chemicals, Inc., or the like, may be used. The former is suitable to form copper wiring. The latter can form micro metal wiring by low-temperature baking at approximately 150° C. to 200° C. The material is not limited to metal. A conductive polymer, such as polyethylene-dioxythiophene (PEDT), may be used, for example. In such a case, sections having different degrees of affinity to the conductive polymer are patterned, and the melted conductive polymer is applied onto the hydrophilic sections.

Another method for making patterns on the substrate so as to fix the functional liquid at predetermined positions of the substrate is to form banks that reduce or prevent overflowing of the functional liquid on the substrate. By this method, the thickness of the device must be increased by the thickness of the banks. Accordingly, a planarization process is required after discharging and baking the functional liquid. However, the method is suitable when making a thick wiring is desired.

<Second Embodiment>

A micro lens array (MLA) has many rows of micro lenses arranged on a substrate and are used in liquid crystal display panels, projectors, scanners, or the like. In forming a micro lens array, a method of discharging a lens material, i.e., a transparent epoxy resin or the like, onto a substrate by an inkjet method may be employed. The shape of each lens and the rows of the lenses can be precisely formed by processing the sections of the substrate where lenses are to be formed to have affinity to this resin while processing the sections of the substrate where no lenses are to be formed to be repellent to this resin.

The method for applying the functional liquid is not limited to the inkjet method. A method that uses a dispenser can also be employed, for example.

The substrate on which the device of this embodiment is formed is not limited to PET, glass, or silicon substrates. The device may be formed on a sheet of paper, for example, so as to detach the device from the paper and attach it on a different substrate.

According to the manufacturing method of this embodiment, the functional liquid can be selectively applied only to the regions where the functional liquid is necessary. Thus, compared to the case where the functional liquid is applied over the entire surface, the material can be efficiently used and the cost can be reduced.

<Third Embodiment>

Figure 3:
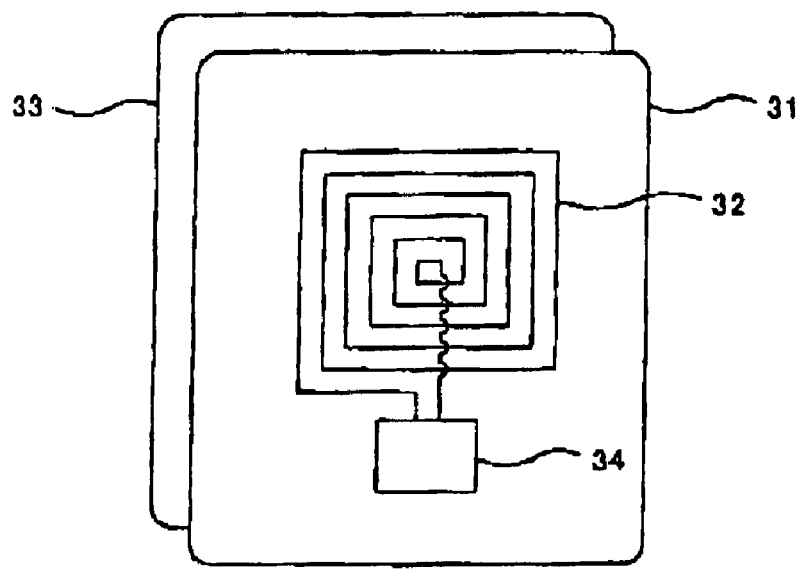
FIG. 3 is a schematic of a speaker made by the method of this embodiment.

FIG. 3 is a schematic of a speaker made by a manufacturing method of this embodiment. As shown in FIG. 3, a liquid in which fine metal particles are dispersed is discharged on a vibrating plate 31 to form a coil 32. The vibrating plate 31 is arranged to oppose a magnetic flux generating unit 33, such as a magnet. An analog signal is generated and a signal current is supplied to the coil 32 on the vibrating plate 31 from an amplifying circuit 34 so that a magnetic flux is generated from the coil 32, and sound is produced by the vibration of the vibrating plate 31 resulting from the interaction between the coil and the magnetic flux generating unit 33. The vibrating plate 31 may be planar or may be of a cone type. The face of the vibrating plate 31 on which the coil is formed may be covered with a waterproof film or the like to form a thin, waterproof speaker.

<Fourth Embodiment>

Figure 4:
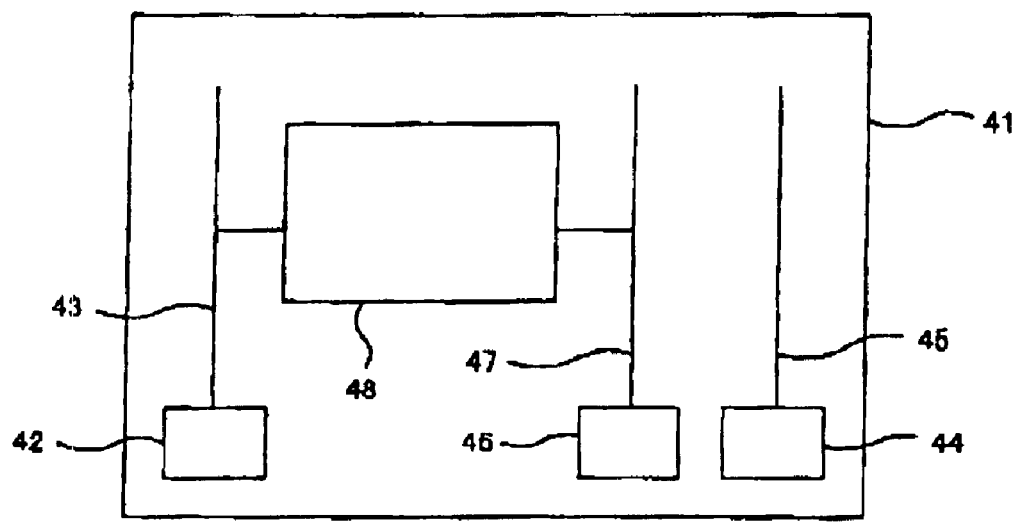
FIG. 4 is a front view of electrical wiring made on a wall by the device making method of this embodiment.

FIG. 4 is a front view of electrical wiring formed on a wall by a method for manufacturing a device according to this embodiment. On a residential wall unit 41, a power terminal 42, a phone terminal 44, a cable TV terminal 46, and the like, are installed. The power terminal 42 is connected to a wire 43, the phone terminal is connected to a signal line 47, and the TV terminal is connected to a signal line 45, so that power and signals can be output. A wall-hanging TV 48 may be installed on the wall unit 41, and the wire 43 and the signal line 47 may be connected to this wall-hanging TV 48 so that broadcast signals can be received and images and sound can be output without exposed components such as electrical cables or the like.

The wire 43 and the signals lines 45 and 47 can be formed by applying a liquid in which fine metal particles are dispersed onto predetermined positions of the wall unit by the inkjet method and by drying and hardening the applied liquid.

<Fifth Embodiment>

Figure 5:
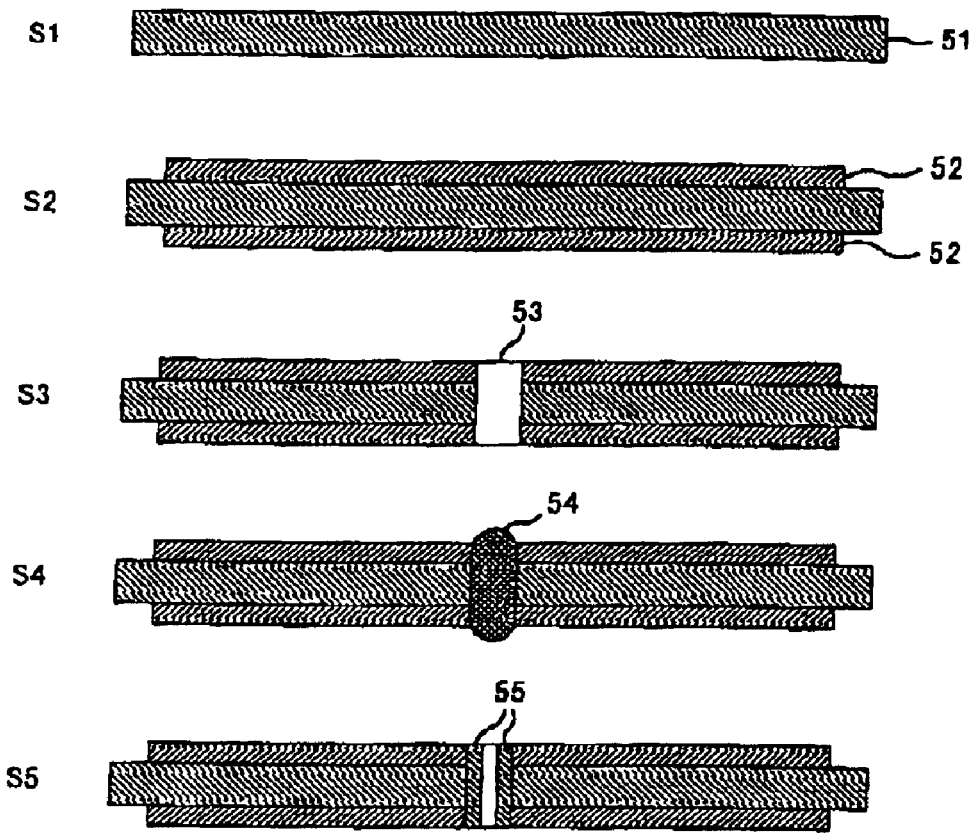
FIGS. 5(S1)–5(S5) are cross-sectional views of a device having three-dimensional wiring according to manufacturing steps made by the device making method of this embodiment.

FIGS. 5(S1)–5(S5) are cross-sectional views of a device having three-dimensional wiring made according to a device manufacturing method of this embodiment. An insulating substrate 51, which is the same as that in the first embodiment, is subjected to a required surface treatment (S1), and multiple layers of electrical circuit patterns 52 are formed on the substrate (S2). Here, two layers of electrical circuit patterns 52 are formed by applying a liquid in which fine metal particles are dispersed onto both surfaces of the substrate by the inkjet method according to predetermined patterns, and by drying and hardening the liquid. The method for forming the multiple layers of electrical circuit patterns 52 is not limited to this. Alternatively, an insulating layer may be formed on an electrical circuit pattern, and another electrical circuit pattern may be formed on the insulating layer.

Next, a hole 53 is formed (S3) in the substrate. The hole 53 is to electrically connect the multiple layers of electrical circuit patterns 52 to each other. Terminals of the multiple electrical circuit patterns 52 are exposed at the wall of the hole 53 at different positions in the substrate thickness direction. The hole 53 may penetrate both surfaces of the substrate or may penetrate only one of the surfaces. The hole 53 may be made by, for example, applying a photosensitive material according to a predetermined pattern and developing the material by exposure, or by etching with a mask having a predetermined pattern. The diameter of the hole 53 is, for example, 100 mm.

Next, a metal-containing liquid 54 is fed into the hole 53 by the inkjet method (S4). The wall of the hole 53 is preferably processed in advance to exhibit affinity to the liquid according to the property of the metal-containing liquid. The multiple layers of electrical circuit patterns 52 can be connected to each other and three-dimensional wiring can be formed by drying and hardening the liquid 54 fed therein. Since a connection between these layers needs to be formed, after hardening, the hole 53 may be completely filled with metal, or alternatively, a metal film 55 may be formed only on the wall of the hole 53 (S5).

<Sixth Embodiment>

Figure 6:
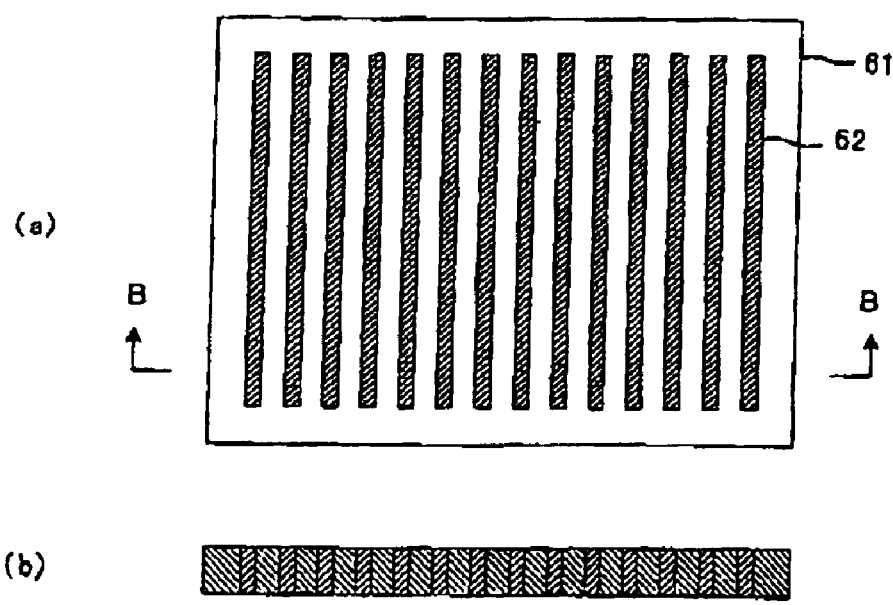
FIGS. 6(a) and 6(b) are a plan view and a cross-sectional view taken along plane B—B of FIG. 6(a), respectively, of an anisotropic conductive film 61 made by the device making method of this embodiment.

FIGS. 6(a) and 6(b) are a plan view and a cross-sectional view taken along plane B—B of FIG. 6(a), respectively, of an anisotropic conductive film 61 made by a device manufacturing method of this embodiment. Slits 62 extending in a predetermined direction are formed in parallel on the surface of a film, such as a silicon rubber film, a polyester film, or the like. After an appropriate surface treatment, a liquid in which fine metal particles are dispersed is discharged into the slits 62 by the inkjet method. The liquid is dried and hardened to form an anisotropic conductive film 61 which is electrically conductive in a particular direction of the film surface and insulative in a direction perpendicular to this particular direction. The slits 62 may penetrate the substrate in the film thickness direction, as shown in FIG. 6(b), or may be formed as grooves that do not penetrate the substrate.

<Manufacturing Apparatus>

Figure 7:
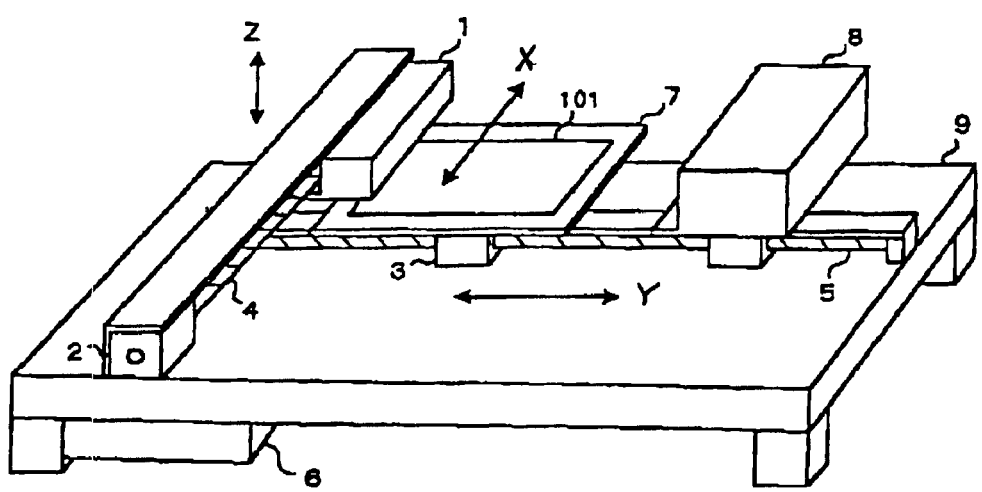
FIG. 7 is a schematic perspective view of a device making apparatus used in the above-described device making method.

FIG. 7 is a schematic perspective view of an apparatus for manufacturing a device used in the above described manufacturing methods. A device manufacturing apparatus 100 includes an inkjet-type functional-liquid supplier, and has an inkjet head group 1, an X-direction driving shaft 4, a Y-direction guiding shaft 5, a controller 6, a table 7, a cleaning mechanism 8, and a base 9.

The inkjet head group 1 has inkjet heads to supply a particular functional liquid, e.g., a metal-containing liquid or a photosensitive material, onto a substrate by discharging the functional liquid from nozzles (apertures).

A substrate 101 of PET, glass, silicon, paper, or the like, onto which the functional liquid is supplied by the functional-liquid supplier, is placed on the table 7. The table 7 has a mechanism to fix the discharge medium at a reference position.

An X-direction driving motor 2 is connected to the X-direction driving shaft 4. The X-direction driving motor 2 is a stepping motor or the like and rotates the X-direction driving shaft 4 upon receiving an X-direction driving signal from the controller 6. When the X-direction rotating shaft 4 is rotated, the inkjet head group 1 moves in the X-axis direction.

The Y-direction guiding shaft 5 is fixed on the base 9. The table 7 has a Y-direction driving motor 3. The Y-direction driving motor 3 is a stepping motor or the like and moves the table 7 in the Y-axis direction upon receiving a Y-direction driving signal from the controller 6.

The controller 6 supplies a voltage to control discharge of droplets to each head in the inkjet head group 1. The controller 6 also supplies a driving pulse signal to control the movement of the inkjet head group 1 in the X-axis direction to the X-direction driving motor 2, and another driving pulse signal to control the movement of the table 7 in the Y-axis direction to the Y-direction driving motor 3.

The cleaning mechanism 8 includes a mechanism to clean the inkjet head group 1. The cleaning mechanism 8 includes a Y-direction driving motor (not shown). The Y-direction driving motor moves the cleaning mechanism 8 along the Y-direction guiding shaft 5. The movement of the cleaning mechanism 8 is also controlled by the controller 6.

Although no exposing apparatus for making hydrophilic & hydrophobic patterns is shown in FIG. 7, a known exposing apparatus, such as that using a mercury lamp, can be used in the manufacturing method of this embodiment.

INDUSTRIAL APPLICABILITY

According to the present invention, a method and a device manufacturing apparatus which can form micro wiring by a low-cost functional-liquid supplying method without undesired wetting and spreading of the droplets can be provided. Moreover, a method and an apparatus for efficiently making a device having three-dimensional wiring can be provided.

What is claimed is:

1. A method for making a device by supplying a functional liquid onto a substrate to form the device, comprising:
   making patterns with the functional liquid at a plurality of sections having different degrees of affinity to the functional liquid on the substrate to form the device;
   supplying the functional liquid to selected sections having high affinity to the functional liquid among said plurality of the sections; and
   the substrate for forming the device being a substrate for a radio frequency identification tag, and the functional liquid being a metal-containing-liquid for forming an antenna of the radio frequency identification tag.

2. A method for making a device by supplying a functional liquid onto a substrate to form the device, comprising:
   making patterns with the functional liquid at a plurality of sections having different degrees of affinity to the functional liquid on the substrate to form the device;
   supplying the functional liquid to selected sections having high affinity to the functional liquid among said plurality of the sections; and forming the plurality of sections having different degrees of affinity to the functional liquid including: forming an organosiloxane film on the substrate, and exposing the organosiloxane film through an optical mask.

3. The method for forming the device according to claim 1, forming the plurality of sections having different degrees of affinity to the functional liquid including: forming a fluoroalkylsilane film on the substrate, and exposing the fluoroalkylsilane film through an optical mask.

4. An apparatus for making a device by supplying a functional liquid on a substrate to form the device, comprising:

a patterning unit to make patterns on a plurality of sections having different degrees of affinity to the functional liquid on the substrate to form the device;

a functional-liquid supplier to supply the functional liquid to selected sections having a high affinity to the functional liquid among said plurality of sections; and the substrate to form the device being a substrate for a radio frequency identification tag, and the functional liquid being a metal-containing-liquid to form an antenna of the radio frequency identification tag.

5. The apparatus for making the device according to claim 4, the patterning unit to form the plurality of sections having different degrees of affinity to the functional liquid including: a photosensitive material supplying subunit to supply an organosiloxane film on the substrate, and an exposing subunit to expose the organosiloxane film through an optical mask.

6. An apparatus for making a device by supplying a functional liquid on a substrate to form the device, comprising:

a patterning unit to make patterns on a plurality of sections having different degrees of affinity to the functional liquid on the substrate to form the device;

a functional-liquid supplier to supply the functional liquid to selected sections having a high affinity to the functional liquid among said plurality of sections; and the patterning unit to form the plurality of sections having different degrees of affinity to the functional liquid including: a photosensitive material supplying unit to supply a fluoroalkylsilane film onto the substrate, and an exposing unit to expose the fluoroalkylsilane film through an optical mask.

* * * * *